United States Patent
Liu et al.

(10) Patent No.: US 7,659,191 B2
(45) Date of Patent: Feb. 9, 2010

(54) GOLD/SILICON EUTECTIC DIE BONDING METHOD

(75) Inventors: Kai Liu, Sunnyvale, CA (US); Ming Sun, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 215 days.

(21) Appl. No.: 11/605,831

(22) Filed: Nov. 27, 2006

(65) Prior Publication Data

US 2008/0124838 A1    May 29, 2008

(51) Int. Cl.
*H01L 21/00* (2006.01)
*H01L 21/76* (2006.01)
*H01L 21/30* (2006.01)
*H01L 21/46* (2006.01)
*H01L 21/44* (2006.01)

(52) U.S. Cl. .............. 438/611; 438/118; 438/406; 438/459; 257/E21.514; 257/E21.596

(58) Field of Classification Search ............... 438/118, 438/119, 406, 458, 459, 460, 611; 257/E21.514, 257/E21.596
See application file for complete search history.

(56) References Cited

U.S. PATENT DOCUMENTS

| | | | | |
|---|---|---|---|---|
| 3,785,892 A | * | 1/1974 | Terry et al. | 438/113 |
| 5,851,845 A | * | 12/1998 | Wood et al. | 438/15 |
| 5,888,883 A | * | 3/1999 | Sasaki et al. | 438/460 |
| 6,376,910 B1 | * | 4/2002 | Munoz et al. | 257/741 |
| 6,939,778 B2 | * | 9/2005 | Harpster et al. | 438/406 |
| 7,598,588 B2 | * | 10/2009 | Davies | 257/499 |

* cited by examiner

*Primary Examiner*—Alexander G Ghyka
*Assistant Examiner*—Seahvosh J Nikmanesh
(74) *Attorney, Agent, or Firm*—Jingming Cai; Schein & Cai LLP

(57) ABSTRACT

A direct gold/silicon eutectic die bonding method is disclosed. The method includes the steps of gold plating a die bonding pad, grinding a wafer to a desired thickness, dicing the wafer after the grinding step, picking a die, and attaching the die to the die bonding pad at a temperature above the gold/silicon eutectic temperature. For thinner wafers, a dicing before grinding process is employed.

14 Claims, 3 Drawing Sheets

GOLD/SILICON EUTECTIC DIE BONDING METHOD

BACKGROUND OF THE INVENTION

The present invention generally relates to a method of bonding a semiconductor die to a package and more particularly to a direct gold/silicon eutectic bonding method.

Conventional die bonding methods include a wide choice of materials that are used in the attachment of silicon dies (with or without back metal) to substrates. These materials include hard and soft solders, conductive epoxies, and gold/silicon eutectic alloys. Gold/silicon eutectic alloys are the preferred choice for small packages such as SOT-23 and SOT-363 and are the only choice for even smaller packages such as SOT-563 and SOT-623.

Conventional gold/silicon eutectic die bonding methods include coating the back surface of the silicon die with gold and then heating the die to a temperature above the eutectic temperature of 370° C. to form the gold/silicon eutectic alloy. In most applications, an adhesion layer of sandwich type structure is used to improve the adhesion of the gold to the silicon die. The die is then attached to a metal leadframe or substrate by an additional heating step which utilizes the gold/silicon eutectic alloy as a solder. Additional layers of gold may be deposited over the gold/silicon eutectic alloy layer and gold or gold alloy pre-forms may be used to facilitate die bonding. Other conventional techniques include using a gold/silicon seed as a catalyst for forming the eutectic bond and using a gold/silicon alloy produced by silicon implantation in a gold layer.

Increased performance requirements of vertical power device products are driving manufacturers to integrate and assemble these devices using thinner wafer processes. Prior art methods of coating the back surface of silicon die formed on thin wafers with metal present difficulties. There is therefore a need for a die bonding method that is simple and does not require a back metal process. There is also a need for a die bonding method that does not require a pre-form, eutectic solder, or seed implant. There is a further need for a die bonding method that is cost efficient and that increases device throughput.

SUMMARY OF THE INVENTION

The problems associated with the bonding of vertical power devices formed on thin wafers to package substrates are solved by the direct gold/silicon eutectic die bonding method of the invention. In accordance with a method of the invention, a die pad of a leadframe is first plated with gold. Then a wafer is either ground to a desired thickness and diced, or alternatively, diced before being ground to the desired thickness using a dice before grinding process. The device is then picked from a dicing tape and attached to the gold plated leadframe die pad at a pre-defined temperature higher than the gold/silicon eutectic temperature of 370° C. to thereby form a gold/silicon eutectic alloy. The silicon on the back side of the die and the gold on the surface of the leadframe can penetrate the silicon oxide layer to form the gold/silicon eutectic alloy with the help of supersonic power and the increase temperature.

In accordance with one aspect of the invention, a gold/silicon eutectic die bonding method includes the steps of gold plating a die bonding pad, grinding a wafer to a desired thickness, dicing the wafer after the grinding step, picking a die, and attaching the die to the die bonding pad at a temperature above the gold/silicon eutectic temperature.

In accordance with another aspect of the invention, a gold/silicon eutectic die bonding method includes the steps of gold plating a die bonding pad, dicing the wafer, grinding the wafer to a desired thickness after the dicing step, picking a die, and attaching the die to the die bonding pad at a temperature above the gold/silicon eutectic temperature.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of the method set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

These and other features, aspects and advantages of the present invention will become better understood with reference to the following drawings, description and claims.

DETAILED DESCRIPTION OF THE INVENTION

The present invention provides a gold/silicon eutectic die bonding method for directly attaching a die to a gold plated leadframe without the need for a wafer back metal process.

Figure 1:
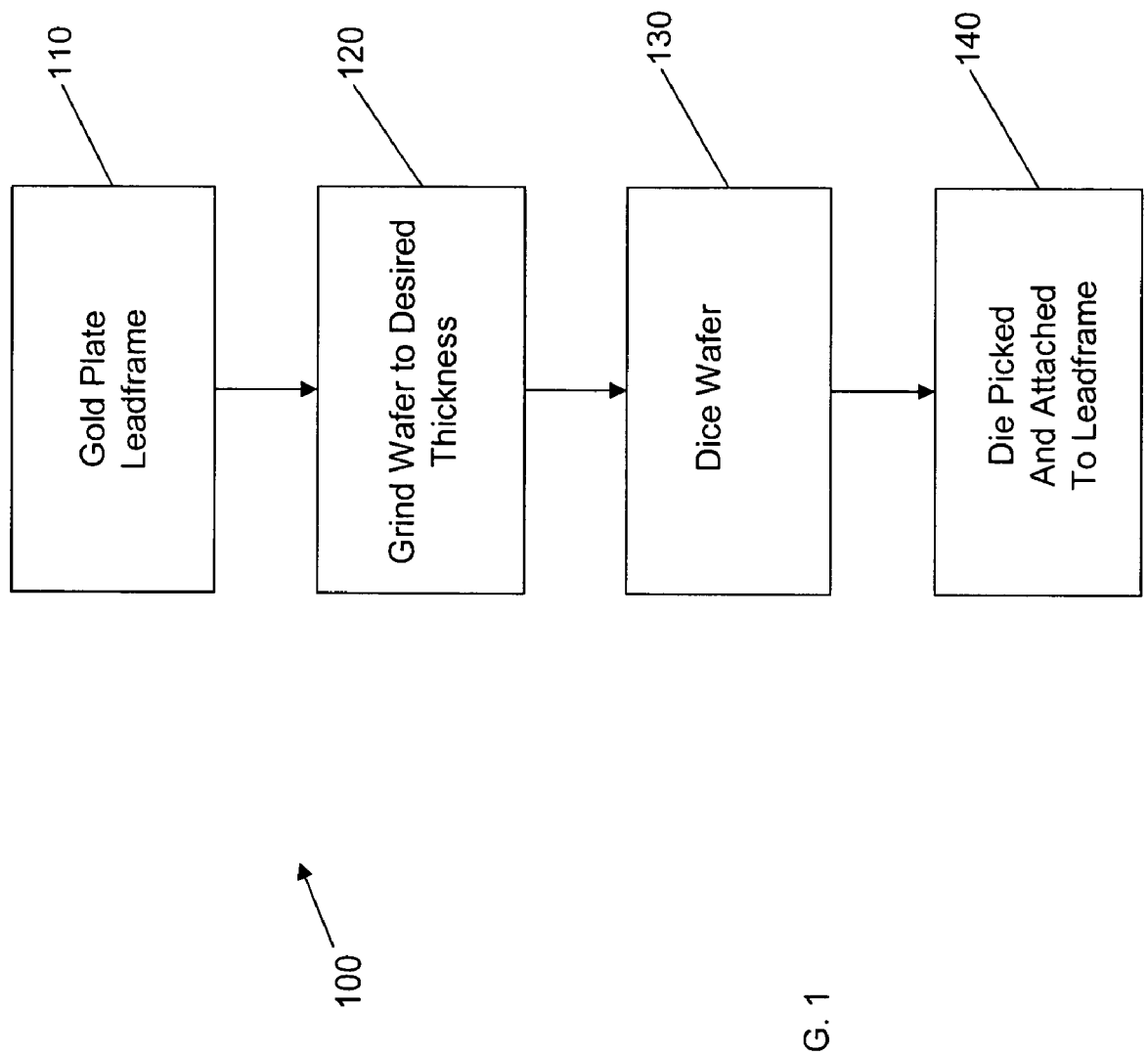
FIG. 1 is a flow chart showing a gold/silicon eutectic die bonding method in accordance with the invention.
Figure 2:
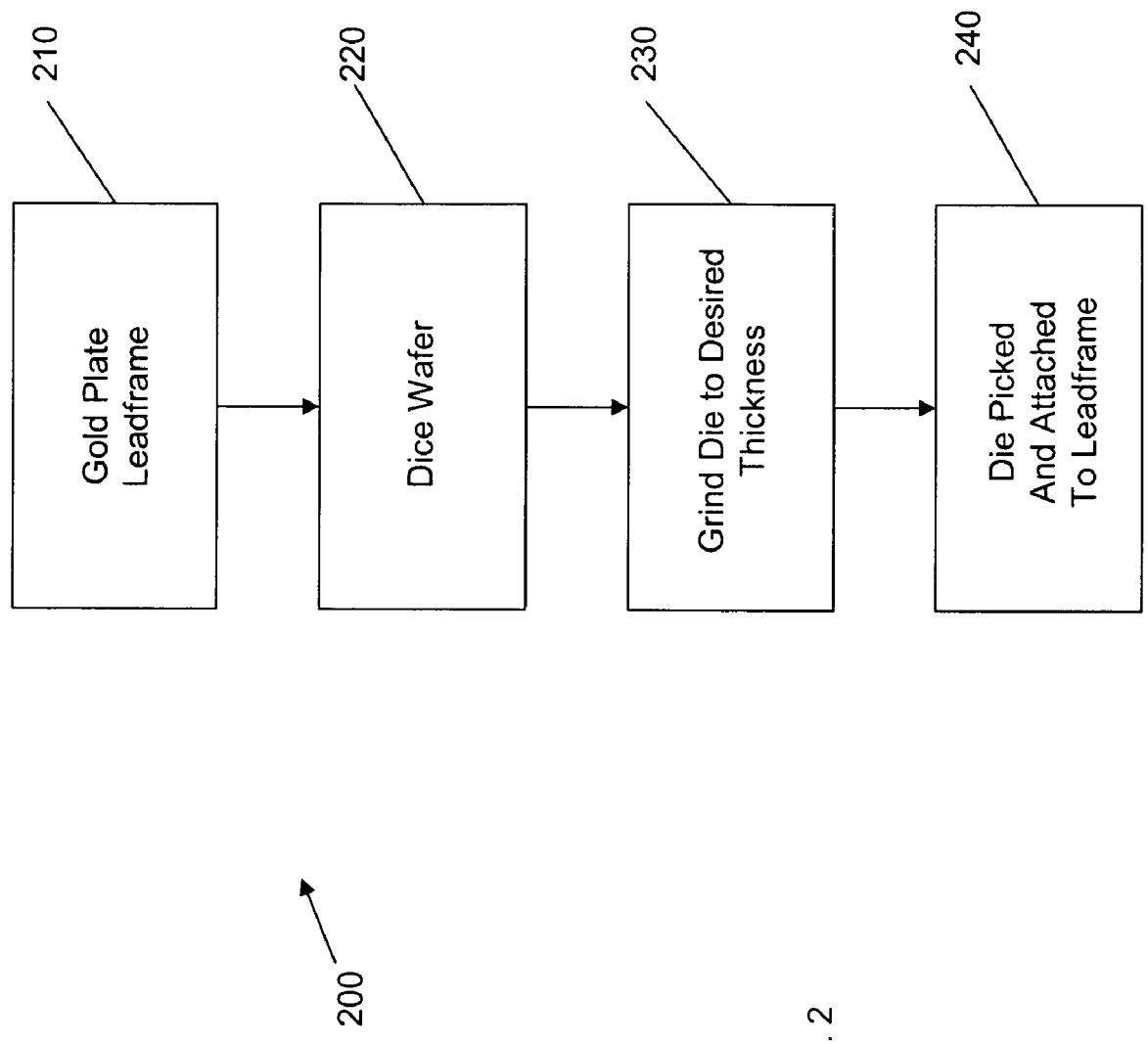
FIG. 2 is a flow chart showing an alternate gold/silicon eutectic die bonding method in accordance with the invention.

With reference to FIG. 1, the method 100 of the invention includes a step 110 in which a die pad of a leadframe is gold plated. In a step 120, the backside of a vertical power MOSFET silicon wafer is ground to a desired thickness, for example, 8 mil. The wafer is then diced in a step 130. The die are then picked from a dicing tape and attached to the die pad in a step 140 at a pre-defined temperature higher than the gold/silicon eutectic temperature of 370° C. to thereby form a gold/silicon eutectic alloy. The silicon on the back side of the die and the gold on the surface of the leadframe die pad can penetrate the silicon oxide layer by scribing or supersonic power at a high enough temperature to form the eutectic alloy.

Figure 3:
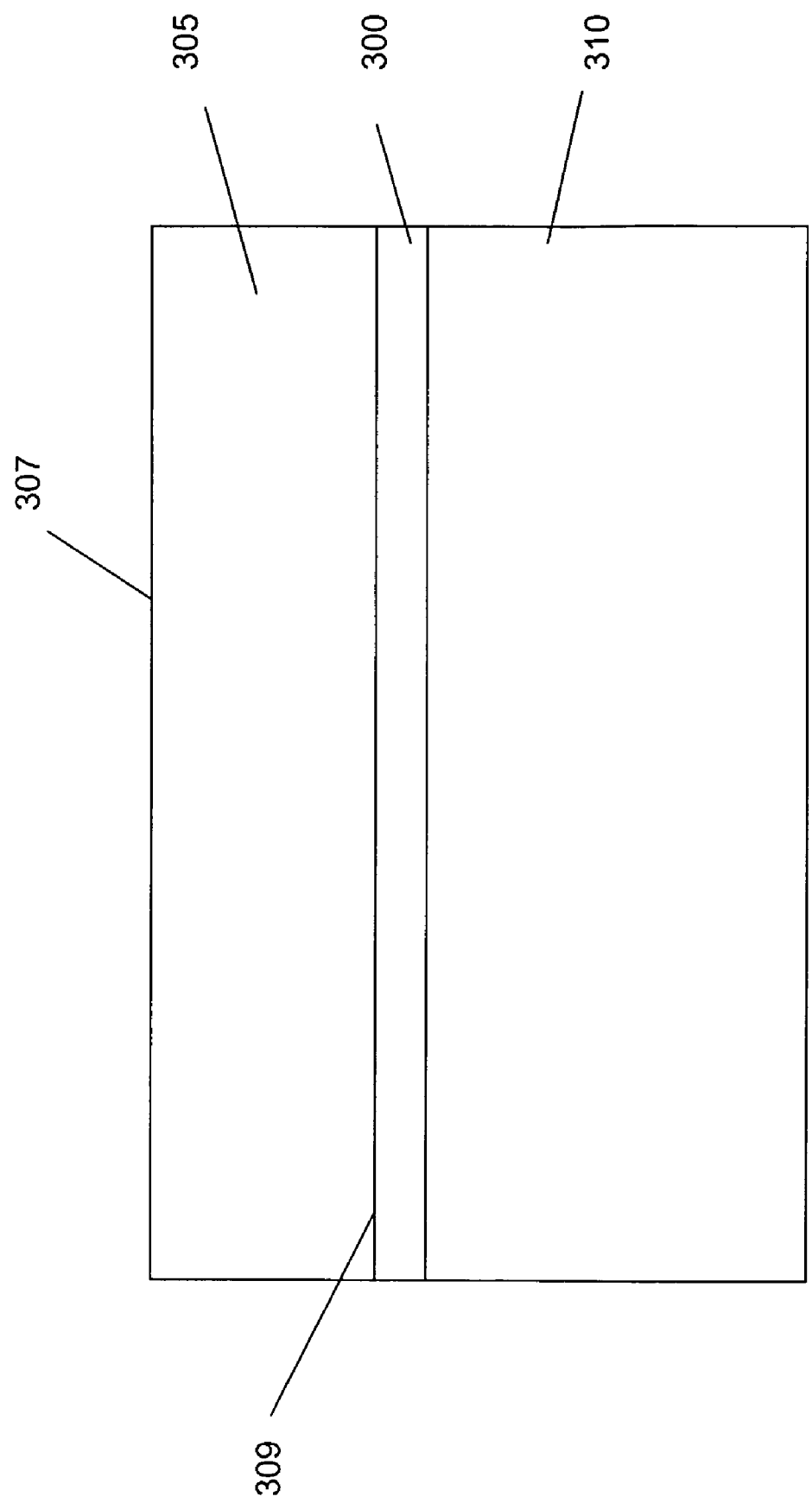
FIG. 3 is a cross sectional view of die bonded to a leadframe showing the gold/silicon eutectic layer in accordance with the invention.

Experimental results show that for a die size of 0.5 mm by 0.5 mm, a temperature of 420° C. is sufficient to achieve a gold/silicon eutectic bond. For die sizes of 1.0 mm by 1.0 mm and 2.0 mm by 2.0 mm, a temperature of 440° C. was sufficient. A cross sectional view of a gold/silicon eutectic bond 300 formed between a die 305 and a leadframe 310 is represented in FIG. 3.

An alternative method 200 of the invention includes a step 210 in which a die pad of a leadframe is gold plated. In a step 220, the vertical power MOSFET wafer is diced from a top surface 307 to a predetermined depth that is deeper than the desired thickness of finished die but shallower than the wafer thickness so that the die are not separate. In a step 230 a back surface 309 of the wafer are ground to a desired thickness such as by a dicing before grinding process. The wafer may be ground to a thickness of between 3 and 4 mil or any desired thickness that is less then the dicing depth to thereby separate the die. Alternatively the wafer may be diced through and the die are separated before grinding. Finally, in a step 240 the die are picked from a dicing tape and attached to the die pad at a pre-defined temperature higher than the gold/silicon eutectic temperature of 370° C. to form a gold/silicon eutectic alloy. The silicon on the back side of the die and the gold on the surface of the leadframe die pad can penetrate the silicon oxide layer by scribing or supersonic power at a high enough temperature to form the eutectic alloy.

The direct gold/silicon eutectic die bonding methods in accordance with the invention provide gold/silicon eutectic die bonding methods that do not require a wafer back metal process. As such the die bonding methods are cost efficient and provide for increased device throughput.

It should be understood, of course, that the foregoing relates to preferred embodiments of the invention and that modifications may be made without departing from the spirit and scope of the invention as set forth in the following claims.

We claim:

1. A direct gold/silicon eutectic die bonding method for bonding a die to a leadframe, the method comprising:
    gold plating a die bonding pad of the leadframe;
    grinding a wafer having formed thereon a plurality of die to a desired thickness;
    dicing the wafer after the grinding step;
    picking one of the plurality of die; and
    attaching the one die directly to the die bonding pad of the leadframe at a temperature above the gold/silicon eutectic temperature.

2. The gold/silicon eutectic die bonding method of claim 1, wherein the die comprises a vertical power device.

3. The gold/silicon eutectic die bonding method of claim 1, wherein the die is 0.5 mm by 0.5 mm and the temperature is 420° C.

4. The gold/silicon eutectic die bonding method of claim 1, wherein the die is 1.0 mm by 1.0 mm and the temperature is 440° C.

5. The gold/silicon eutectic die bonding method of claim 1, wherein the die is 2.0 mm by 2.0 mm and the temperature is 440° C.

6. The gold/silicon eutectic die bonding method of claim 1, wherein a bare surface of the one die is attached directly to the die bonding pad.

7. A direct gold/silicon eutectic die bonding method for bonding a die to a leadframe, the method comprising:
    gold plating a die bonding pad of the leadframe;
    dicing a wafer having formed thereon a plurality of die;
    grinding the wafer to a desired thickness after the dicing step;
    picking one of the plurality of die; and
    attaching the one die directly to the die bonding pad of the leadframe at a temperature above the gold/silicon eutectic temperature.

8. The gold/silicon eutectic die bonding method of claim 7, wherein the die comprises a vertical power device.

9. The gold/silicon eutectic die bonding method of claim 7, wherein the wafer is diced to a depth shallower than a thickness of the wafer.

10. The gold/silicon eutectic die bonding method of claim 7, wherein the die are ground to a thickness of between 3 and 4 mils.

11. The gold/silicon eutectic die bonding method of claim 7, wherein the die is 0.5 mm by 0.5 mm and the temperature is 420° C.

12. The gold/silicon eutectic die bonding method of claim 7, wherein the die is 1.0 mm by 1.0 mm and the temperature is 440° C.

13. The gold/silicon eutectic die bonding method of claim 7, wherein the die is 2.0 mm by 2.0 mm and the temperature is 440° C.

14. The gold/silicon eutectic die bonding method of claim 7, wherein a bare surface of the one die is attached directly to the die bonding pad.

* * * * *